United States Patent [19]

Murphy

[11] Patent Number: 5,103,976
[45] Date of Patent: Apr. 14, 1992

[54] TRAY FOR INTEGRATED CIRCUITS WITH SUPPORTING RIBS

[75] Inventor: Robert H. Murphy, Merrimack, N.H.

[73] Assignee: R. H. Murphy Company, Inc., Amherst, N.H.

[21] Appl. No.: 587,966

[22] Filed: Sep. 25, 1990

[51] Int. Cl.⁵ ............................................. B65D 73/02
[52] U.S. Cl. .................... 206/328; 206/509; 206/564; 206/565; 220/507
[58] Field of Search ............... 206/328, 329, 332, 334, 206/509, 511, 560, 562, 564, 565; 220/506, 507

[56] References Cited

U.S. PATENT DOCUMENTS

| | | | |
|---|---|---|---|
| 3,661,253 | 5/1972 | Cronkhite | 206/65 R |
| 4,671,407 | 6/1987 | Brutsoky | 206/332 |
| 4,765,471 | 8/1988 | Murphy | 206/329 |
| 4,767,984 | 8/1988 | Bakker | 324/158 F |
| 4,826,440 | 5/1989 | Plocek et al. | 439/70 |

FOREIGN PATENT DOCUMENTS

| | | | |
|---|---|---|---|
| 0358063 | 3/1990 | European Pat. Off. | 206/332 |
| 0279080 | 11/1989 | Japan | 206/328 |

Primary Examiner—Paul T. Sewell
Assistant Examiner—Thomas P. Hilliard
Attorney, Agent, or Firm—Pearson & Pearson

[57] ABSTRACT

A tray for storage and transportation of multiple pin grid array (PGA) integrated circuit components. The tray has a lattice framework that defines discrete storage pocket areas. Each storage pocket area comprises a base support that spans portions of the framework and includes upstanding ribs that engage the integrated circuit component. The locus of the upstanding ribs of a given set constitutes a rectangle or square that is concentric with and spaced from the locus of other sets of upstanding ribs. Depending terminal pins from the housing lie between individual ones of the upstanding ribs. The trays are stackable.

22 Claims, 3 Drawing Sheets

TRAY FOR INTEGRATED CIRCUITS WITH SUPPORTING RIBS

BACKGROUND OF THE INVENTION

1. Field of the Invention

This invention generally relates to integrated circuits and more specifically to devices for the storage and transport of such integrated circuits.

2. Description of Related Art

The storage and transportation of semiconductor components have become important considerations in the production of electronic assemblies, especially as semiconductor components have matured from inexpensive, elementary circuit elements into expensive, sophisticated, complex circuit components. As these components have grown in complexity, they have become more susceptible to damage from a number of external influences, such as mechanical shock and discharges of accumulated electrostatic charge. Consequently, there have been many changes in the transportation, assembly and testing procedures that in electronic assembly production facilities utilize. Such procedures, when properly implemented, now contribute significantly to the success of such electronic assembly facilities.

For example, in certain circumstances it is important to transport a component, such as an integrated circuit, pretest it, and provide ready access to the component for delivery to or insertion into a printed circuit board. "Chip carriers" now provide such functions for individual components. A "chip carrier" is a special fixture that houses and protects an individual component, such as an integrated circuit, from damage due to mechanical shock or electrostatic discharge during processing, production, testing and assembly operations. It also can orient an integrated circuit during the production process, assure proper placement and alignment of terminals for testing and for insertion into a printed circuit board.

In other circumstances, there may only be a requirement for the storage and shipment of large numbers of integrated circuits and like components without testing. For example, integrated circuit manufacturers ship such components to customers in bulk quantities. Some customers may desire to move such components in groups or sets directly to a printed circuit board. Other customers may desire to transport or store such components and then transfer the components to chip carriers or the like for further transportation and testing. When this limited requirement exists, it is difficult to justify the costs of purchasing and handling individual chip carriers.

There are a number of devices that store or carry semiconductor components and the like in a plurality of pockets. Examples of such devices are illustrated in the following U.S. Pat. Nos.:

3,469,686 (1969) Gutsche et al
3,482,682 (1969) Cronkhite
3,661,253 (1972) Cronkhite
3,946,864 (1976) Hutson
4,057,142 (1977) Lechner et al The Gutsche and both Cronkhite patents disclose a series of marginally registrable plastic trays. Each tray has a plurality of wells characterized by tapered walls that support a single semiconductor wafer within each well. The tapered walls prevent a polished face of a wafer from contacting any surface of the tray. It is possible to nest or stack individual trays for shipment as a unit. Thus, these trays provide a means for the bulk storage and transportation of semiconductor wafers. Cronkhite patents provide a removable cap member that is disposed upon a rim-forming element of each well. Each cap member has a recessed portion that engages an upwardly presented surface of a semiconductor wafer to hold the wafer in a substantially immobile position in the well.

The Hutson patent discloses a package for semiconductor chips with first and second transparent plastic sheets that each contain an array of discrete and spaced depressions. When the sheets are stacked, the depressions in adjacent sheets nest and form a plurality of discrete compartments for containing the semiconductor chips. The sheets attach to each other about their peripheries to form a package for transmitting the chips in bulk. Apertures through each plastic sheet in the region of the compartments are smaller ,than the chips and allow access for physical testing and visual inspection while the chips remain constrained within the compartments.

The Lechner et al patent discloses a plastic pallet with plural circular depressions formed for containing semiconductor disks on an individual basis. When individual pallets are stacked on top of one another in opposite directions, they position part sector surfaces so they slope alternatively upward and downward. The upward sloping surface in one pallet is immediately above a downward sloping surface in an adjacent pallet. These counterfacing surfaces clamp the edges of the semiconductor disk so the disk can be transported with substantially no abrasion between the semiconductor disks and the pallets.

Although the foregoing references disclose generally devices for storing semiconductor wafers, such wafers do not have terminal pins that are normally encountered in finished integrated circuits. These trays are not readily adapted to devices with terminal pins. The following United States Letters Patent do disclose devices for the shipment and transportation of integrated circuit components or for circuits utilizing such integrated circuit components:

4,210,243 (1980) McDowell
4,725,918 (1988) Bakker
4,792,042 (1988) Koehn et al

McDowell discloses a tray for holding integrated circuit packages of the transistor outline type. Such packages have cylindrical cases with preformed leads that flair radially outward from the bottom of the package. Flat portions of the free ends of the leads lie in a common plane. A tray for transporting a plurality of such packages has a top plate with a plurality of funnel shaped openings each having a cylindrical bottom portion for receiving a case. The top and bottom edges of the trays are dimensioned so that the top of a first tray nests inside the bottom of a second tray. When the nested trays are turned over, packages and openings in the first tray sit with the flat portions of their leads on the bottom of the second tray. A rim limits transverse movement of the packages set on the plate when the tray is shaken to cause them to fall into associated openings.

The Koehn et al patent discloses a chip carrier for individual electronic circuits. The chip carriers adapt for stacking for shipment. This enables a number of integrated circuit components to be shipped in bulk in a single package.

The Bakker patent discloses a box for storing electronic devices apparently including integrated circuits. The box includes a material that minimizes electrostatic accumulation and resultant discharges that could otherwise damage the electronic device.

Each of the foregoing references describes a device for use with a component of a single size or limited range of sizes. For example, semiconductor wafer and integrated circuit manufacturers use wafers of a given size or limited number of sizes. There are a limited number of transistor outline package sizes. As a result there is justification for the effort of designing specially formed trays or other devices according to the foregoing references.

However, these approaches do not adapt readily for the transportation and storage of pin grid array integrated circuit components. A pin grid array (PGA) integrated circuit component typically has a thin planar housing of a ceramic or other material for containing a semiconductor substrate and related circuitry. Terminal pins extend perpendicularly to one planar surface of the housing. The terminal pins define an array or matrix of columns and rows with an industry-standard spacing. Currently the spacing is 0.1 inch. PGA integrate circuit components come in myriad sizes that are defined alternatively by the size of the housing (from a 1 inch square to a 2.5 inch square) or by the size of the matrix (from a 9×9 terminal pin matrix to a 25×25 terminal pin matrix). Thus the adaption of a prior art design for accommodating PGA integrated circuit components would require a facility to inventory large number of specially sized trays.

A device for transporting and storing PGA integrated circuit components must also accommodate other characteristics inherent in such components. As previously indicated many electronic assembly facilities now utilize robotic devices to retrieve a component from a storage device, orient that component accurately and position and insert the component with respect to a printed circuit board or a chip carrier. It is critical for the robotic device to "know" the position of the pins. If the robotic device only "sees" the housing, placement errors can result. Although tight tolerances exist with respect to the relative positions of the terminal pins, only relaxed tolerances exist as to the position of the terminal pin array with respect to the housing. The prior art trays and devices rely on the engagement of a housing or wafer edge. If such devices were adapted to PGA components, there would be no direct repeatable correlation between the tray and the terminal pins.

It also is desirable that any device for transporting and storing PGA integrated circuit components provide other desirable benefits. For example, it is possible for any number of external forces to transfer to the terminal pins with force components directed along and transversely to the terminal pins. To some degree, the device should protect the terminal pins from damage due to such mechanical shock during transport. The device also should prevent the accumulation of an electrostatic charge on the PGA integrated circuit component to avoid a potential discharge and damage.

SUMMARY

Therefore it is an object of this invention to provide an economical device for the transportation and storage of electronic components, particularly pin grid array integrated circuit components.

Another object of this invention is to provide a device for storing and transporting electronic components, particularly pin grid array integrated circuit components, that accurately positions the terminal pins from such components.

Another object of this invention is to provide a storage and transportation device for electronic components, particularly pin grid array integrated circuit components, that protects terminal pins emanating from such components from mechanical stock.

Still another object of this invention is to provide a device for storing and transporting electronic components, particularly pin grid array integrated circuit components, that minimizes stresses that can be applied to terminal pins emanating from such components.

Yet another object of this invention is to provide a device for storing and transporting electronic components, particularly pin grid array integrated circuit components, that is stackable with similar devices thereby to enable the shipment and storage of a large number of components in a single package.

Yet still another object of this invention is to provide a device for storing and transporting electronic components, particularly pin grid array integrated circuit components, that facilitates both manual and automated handling techniques for such electronic components.

In accordance with this invention, a device for storing and transporting electronic components characterized by a housing and plurality of parallel terminal pins comprises a lattice-like framework that defines discrete storage pocket areas. Base support means span the portions of the framework at each storage pocket area and support sets of upstanding rib means. The upstanding rib means in a given set are coextensive with intermediate portions of the sides of a rectangle that is centered intermediate certain columns and rows of terminal pins extending from the component. The rib means engage the housing to support the component with the terminal pins spaced from the base support means.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENTS

Figure 1:
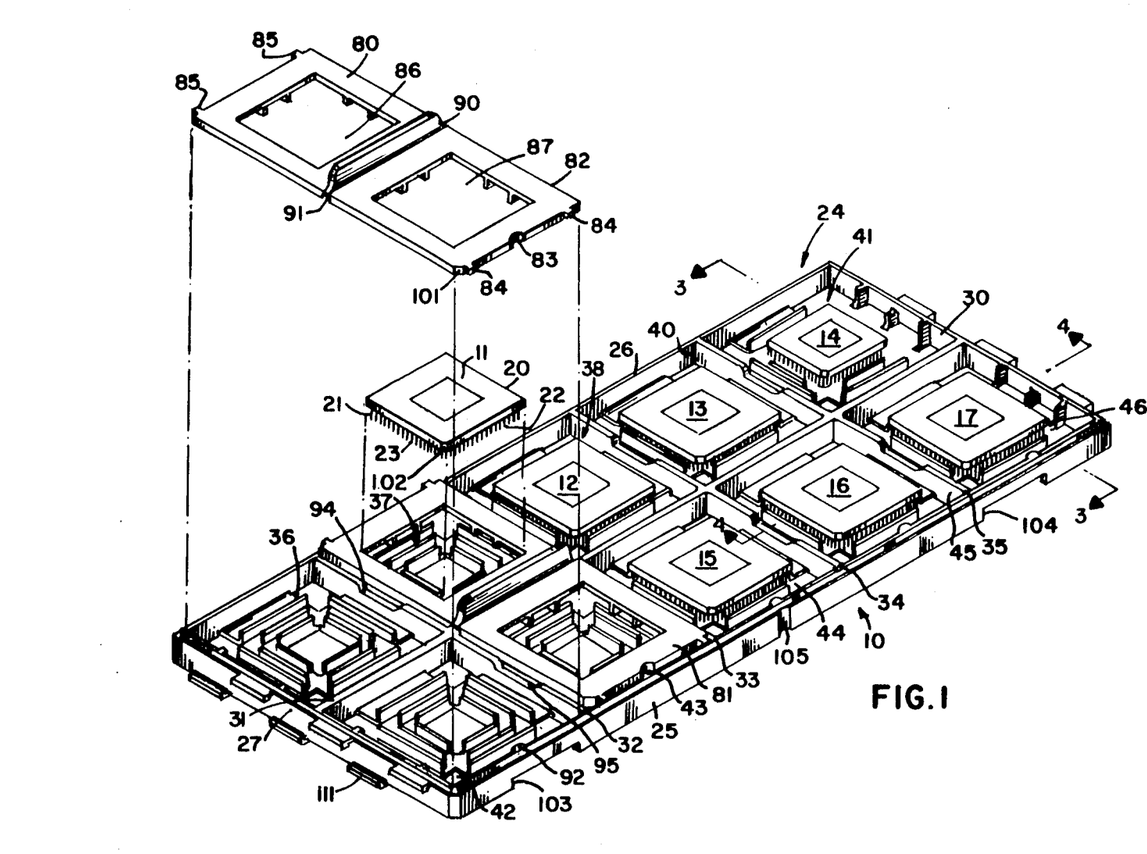
FIG. 1 is a perspective view of a device that is constructed in accordance with this invention for storing and transporting electronic components and a template for facilitating the manual placement of such components in the device.

A device for storing and transporting integrated circuit components or the like constructed in accordance with this invention comprises a tray 10 as shown in FIG. 1. In this particular embodiment the tray 10 carries a number of pin grid array integrated circuit components (called "PGA components" in the following description) 11 through 17 at discrete locations. By way of example, the PGA component 11 has a planar ceramic housing 20 with a plurality of terminal pins 21 that extend transversely from a planar surface of the housing 20. In the orientation shown in FIG. 1, the terminal pins 21 extend downwardly from the housing 20 and are arranged in a two-dimensional matrix having columns 22 and rows 23 of terminal pins 21. Industry standards establish with accuracy the spacing and the diameter of the terminal pins 21. Typically the spacing is 0.100 inches and the terminal pin diameter is 0.018 inches. The area of the housing 20 depends upon the number of terminal pins.

A tray 10 as specifically shown in FIG. 1 is adapted to accept a PGA component with terminal pins 21 arranged in twenty-one columns 22 and twenty-one rows 23. In a typical component, the housing 20 has a maximum thickness of 0.135 inches, and the terminal pins 20 are 0.200 inches long. These dimensions are current industry standards, and they determine many of the spatial relationships in the tray 10 as will become apparent.

The tray 10 shown in FIG. 1 is an integrally molded device composed of any of a wide variety of thermoplastic materials characterized by providing a stiff or rigid and dimensionally stable molded product. The selection of a particular thermoplastic depends, in part, upon the environment in which the tray 10 is used. If the tray 10 will be used for shipping and handling at low temperatures, for example, under 75° C. or so, a filled thermoplastic, such as a glass-filled styrene, polypropylene or similar thermoplastic is appropriate. Normally, it is advantageous to coat the tray 10 with an antistatic solution that will dissipate any electrostatic charges that otherwise might accumulate. At higher temperatures, a conductive plastic is more appropriate. The conductive plastic may comprise any of a wide variety of easily molded, conductive and thermally and dimensionally stable materials. A carbon-filled polyether sulfone material is preferred. Other materials include carbon- or aluminum-filled polyether imides, polyaeryl sulfones and polyesters. The conductive filler protects the components on the tray 10 from an accumulation of electrostatic charge.

Referring now to FIGS. 1 through 4, the tray 10 has a lattice-like framework 24 that divides the tray 10 into an arbitrary number of rectangular or square discrete storage pocket areas. In the particular embodiment shown in FIG. 1, the framework 24 comprises a plurality of transverse beams that define ten storage pocket areas arranged in two columns and five rows. Specifically, the framework 24 comprises a front beam 25, a parallel spaced back beam 26, a left side beam 27 and a right side beam 30 that define the periphery of the tray 10. A center beam 31 extends midway between and parallel to the front and back beams 25 and 26. Intermediate center beams 32, 33, 34 and 35 extend transversely to the front and back beams 25 and 26. As shown particularly in FIG. 1, the net effect of this particular framework 24 is a lattice with storage pocket areas 36 through 38 and 40 through 46 that individually receive PGA components.

Figure 2:
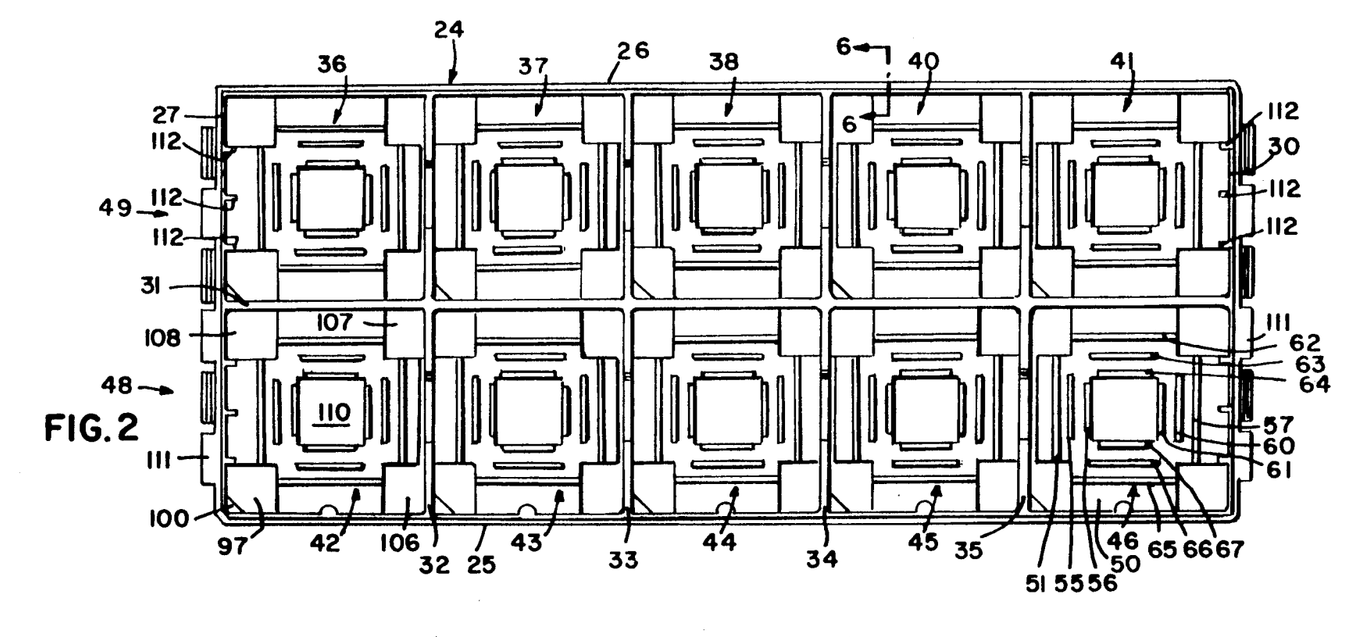
FIG. 2 is a top view of one embodiment of a storage device as shown in FIG. 1.
Figure 3:
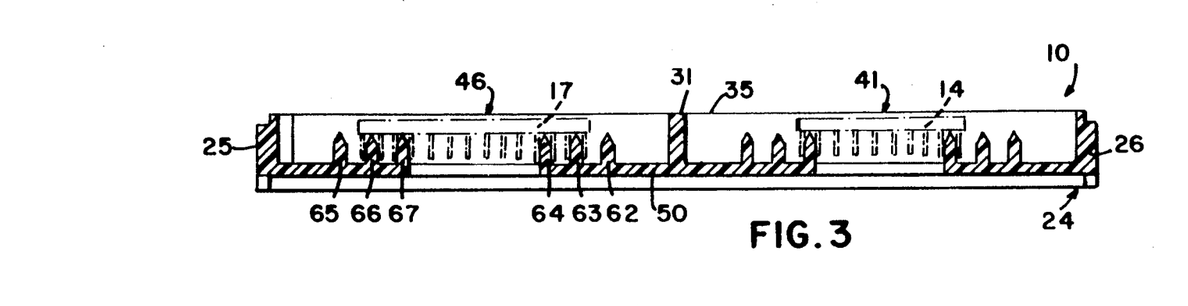
FIG. 3 is an enlarged cross-sectional view taken along lines 4—4 in FIG. 2.
Figure 4:
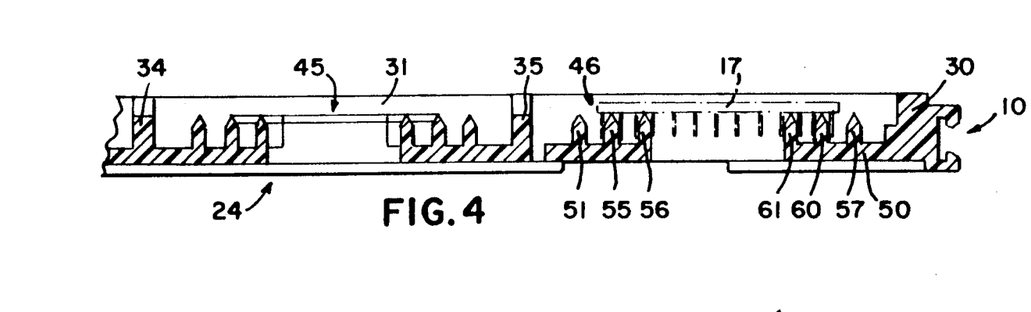
FIG. 4 is an enlarge cross-sectional view taken along lines 4—4 of FIG. 2.

The following description relates first to similar structures of each storage pocket area, in terms of the pocket storage area 46 shown in FIGS. 2 through 4, and then to differences among the various pocket storage areas. Specifically, the front beam 25, center beam 31, side beam 30 and intermediate beam 35 define the periphery storage pocket area 46 and support a base support means in the form of a planar base plate section 50. The base support plate section 50 has a cruciform shape with a plurality 48 of integrally molded upstanding ribs extending perpendicularly to the plane of the base plate 50.

Figure 5:
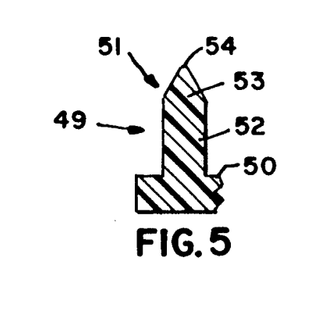
FIG. 5 is a detailed cross-sectional view of an upstanding rib means shown in FIGS. 1 through 4.

As shown in FIG. 5, each rib means 51 has a main body portion 52 that extends perpendicularly from the base plate section 50 and terminates with a tapered portion 53 defining a top surface 54. This tapered rib configuration facilitates the loading of an integrated circuit into the tray. During manual loading particularly, the tapered section 53 tends to align with the terminal pins so they clear the rib 51. Moreover, the width of the main body portion 52 corresponds to the predetermined clearance between pins in the adjacent columns and rows of the terminal pin array.

Referring again to FIGS. 2 through 4 and the storage pocket area 46, ribs 55 and 56 are parallel to and spaced from the rib 51. The spacings between this first group of adjacent ribs 51, 55 and 56 are a multiple of the predetermined center-line spacing for terminal pins; in this embodiment the multiple is three. The distance between the counterfacing surfaces of adjacent pairs of the ribs 51, 55 and 56 corresponds to the dimension across the outside surfaces of adjacent columns or rows of terminal pins. A second group of parallel ribs 57, 60 and 61 having similar spacing are spaced from the set of ribs 51, 55 and 56.

FIG. 4 depicts, in phantom, a PGA component 17 with its terminal pins extending downwardly. The tops of the upstanding ribs 55, 56, 60 and 61 engage the bottom of the PGA component housing along orthogonal lines and space the ends of the terminal pins from the base plate portion 50. The upstanding ribs 55, 56, 60 and 61 also are between the various terminal pins. In this figure, the integrated circuit 17 has a terminal pin array of fifteen columns and fifteen rows so the outer upstanding ribs 51 and 57 do not contact the housing of the integrated circuit 17. This configuration isolates the terminal pins from any mechanical shock due to external forces.

Still referring to FIGS. 2 through 4, the pocket storage area 46 additionally comprises a third group of upstanding ribs 62, 63 and 64 and a fourth set of upstanding ribs 65, 66 and 67. These ribs are parallel to each other and the third and fourth groups are spaced from each other. As a result the first and second group of ribs 51, 55, and 56 and 57, 60 and 61 are transverse to the third and fourth groups of ribs 62, 63 and 64 and 65, 66 and 67. The ribs 51, 62, 57 and 65 constitute a set of upstanding ribs, and the locus of this set of upstanding ribs is a rectangle, in this particular embodiment a square. The individual ribs of this set occupy only intermediate portions of the sides of the locus. Likewise, the locus of a second set of upstanding ribs 55, 63, 60 and 66 is a smaller concentric square. The locus of a third set of ribs 56, 64, 61 and 67 is a smaller concentric square. Thus, the upstanding rib means in any set are coextensive with intermediate portions of the sides of a rectangle or square that is concentric with and spaced from a rectangle or square that is the locus of another set of upstanding ribs. The spacing between the corresponding upstanding ribs in adjacent sets is a multiple of the spacing between the terminal pins; in this embodiment the multiple is two.

As each upstanding rib is coextensive with only a portion of the side of its respective locus, the corners are open or free of any ribs. This open construction provides two advantages. First, it enables the tray 10 to support PGA components having either an odd or even number of rows and columns of terminal pins. PGA components with an odd number of columns and rows center in the pocket storage area; those with even number offset diagonally from the center. Some PGA components have pads at the corner pins, and this construction prevents the ribs from contacting such pads.

The center spacings between opposed groups of parallel ribs, such as the distance between the upstanding ribs 56 and 61 in the first and second groups, also corresponds to terminal pin spacing. In a particular example, the center-line distance between the upstanding ribs 57 and 61 is nine times the terminal pin center-line spacing.

It now will be apparent that the tray 10 fulfills several objectives of this invention. The upstanding ribs adapt the tray for storing and transporting PGA components. A single tray with plural sets of upstanding ribs can store PGA components of various sizes. The tray 10 minimizes the problems of mechanical shock because components of force transverse to the general plane of the tray 10 transfer to the PGA component through several paths; and tend to dissipate before they reach the PGA component housing and terminal pins. The tray 10 tends to apply force components in the plane of the tray equally to multiple terminal pins adjacent the upstanding ribs. The spacing between the ends of the terminal pins and the base plate section isolates axial forces from reaching the terminal pins. Finally, the construction of integrally molded conductive plastic minimizes the potential for accumulating an electrostatic charge on the PGA component.

Figure 6:
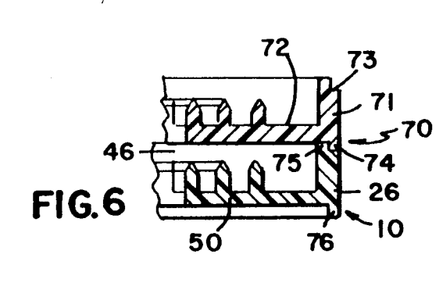
FIG. 6 illustrates a portion of the periphery of a multiple devices as shown in FIG. 1 in a stacked relationship.

FIG. 6 is a detail along a section line 6—6 in FIG. 2 that illustrates portions of two trays in a stack. Particularly, FIG. 6 depicts a tray 70 stacked on the tray 10 with its back beam 26. The tray 70 has an back beam 71 and a base plate section 72. The back beam 71 and the front and side beams of the tray 70 have a shoulder 73 formed along their respective lengths. The back beams 70 and 26 have downwardly extending lips 75 and 76, respectively. The other outer beams also contain lips. Thus, as a tray 70 is positioned over a tray 10, lip sections, such as lip section 75 engage the respective shoulder section 74 of the tray 10. This interlocks the periphery of the trays 10 and 70 locking them together in a lateral direction. The depth of each pocket storage area, such as the pocket storage area 46 shown in FIG. 4, is selected to the base support section 72 of the upper tray 70 does not interfere with or contact a PGA component housing supported in the lower tray 10.

The tray 10 of FIG. 1 and templates facilitate the manual placement of PGA components in the tray. FIG. 1 depicts a template 80 overlying storage pocket areas 37 and 43 and a template 81 spaced above storage pocket areas 46 and 42. The template 80 has a planar frame 82 with a vertical keyway 83 formed at one end and longitudinally extending lips 84 and longitudinally extending lips 85 extending from the opposite ends of the frame 82. Two central openings 86 and 87 conform generally to a specific package outline for a PGA component. In this specific embodiment, for example, the templates 80 and 81 position 15×15 PGA components.

An upstanding handle 90 traverses the center of the panel 82 for facilitating the template by aligning the template with the center beam 31. The template 80 engages the beam 31 at a slot 91 through the opposite surface of the template 80 in the plane of the handle 90. As an operator moves the template 80 toward the tray 10, the keyway 83 engages a key 92. The key 92 has a semi-cylindrical shape and is centered in the pocket storage area 42. The storage pocket areas 43, 44, 45 and 46 have storage keys. When the slot 91 engages the central beam 31, the fingers 84 and 85 engage the front beam 25 and the back beam 26 respectively to align the template 80 above the pocket storage areas 36 and 42. This places the template in the position shown in FIG. 2 with the template 81 overlying the pocket storage areas 37 and 43.

Thus the square apertures through the template 81 are accurately aligned with respect to the upstanding ribs in each of the storage pocket areas 37 and 43. It then is possible to accurately position the integrated circuit 11 by lowering it through an aperture until the tapered end portions of the upstanding ribs, such as the tapered end portion 43 in FIG. 5, interact with the depending terminals pins. When the PGA component rests on the ribs, the tray precisely positions the terminal pins with respect to the tray 10.

Centrally disposed slots or access passages between adjacent pocket storage areas facilitate manual removal of the PGA components. For example, the intermediate beam 32 has a slot 94 formed in the upper surface centrally with respect to pocket storage areas 36 and 37. A centrally disposed slot 95 centers along the intermediate beam 32 with respect to the pocket storage areas 42 and 43. These slots enable an individual to grasp the edge of a PGA component more readily.

As previously indicated and shown in FIGS. 1 and 2, each of the bottom panels, such as the base plate section 50 in the pocket storage area 46, has a cruciform shape defined by corner apertures. As best seen in FIG. 2 a corner aperture 97 additionally has a diagonal fillet 100 that provides a visual reference for purposes of alignment. This, and similar fillets in each pocket storage area coact with corresponding chamfers on each template, such as the chamfer 101 on the template 80 as shown in FIG. 1, to facilitate component orientation. Specifically, the orientation between the template 80 and the pocket storage areas 35 and 42 is proper if the chamfer 101 and the fillet 100 align. Moreover, some PGA components may have a chamfered corner, such as a chamfered corner 102 formed on the housing 20. This further facilitates correct alignment and orientation when the various diagonal surfaces align.

The front beam 25 of the lattice framework shown in FIG. 1 has a slot or pick point 103 formed proximate the pocket storage area 42 and a similar pick point 104 proximate the pocket storage area 46. Similar constructions on the back beam 26 facilitate automated handling of the trays, even in a stacked position.

The front beam 25 contains a centrally disposed vertical depression 105. When trays are stacked properly, the depressions in all the trays align. A misalignment is apparent visually because such a misalignment breaks the general line formed by the depressions that exists when all the trays are oriented in the same position in the stack.

In automatic production facilities, robotic devices can place integrated circuits in a tray or remove them for placement in a chip carrier or a printed circuit board. This requires dimensional stability in order that the relationship between a reference point on the tray and the terminal pin positions remain fixed and predictable.

The tray 10 in FIG. 1 has certain construction characteristics that provide the necessary dimensional stability. First, the molded materials themselves have dimensional stability. Second, in the tray 10, as shown in FIG. 2, the bottom base plate sections in the storage packet areas 36, 37, 40, 41, 42, 43, 45 and 46 connect only to three of the lattice work beams defining each storage pocket area. For example, the base plate section 50 in the storage pocket area 46 connects only to the beams 31, 30 and 25. There is a clearance space between the base plate section 50 and the beam 35. As a tray cools after molding, these clearances allow the base plate section to cool without the introduction of fixed internal stresses that could distort the tray 10. The open structure of the upstanding ribs also contributes to dimensional stability because thermal expansion or contraction will tend to lengthen or shorten each rib independently of the other ribs. This minimizes any stress transfers as could occur if the ribs in a square or rectangle were joined at the corners. Thus the tray 10 remains flat during use.

As a third step, the storage location 42, by way of example, includes the corner aperture 97 and corner apertures 106, 107 and 108 and these apertures produce the cruciform shape of the base plate sections. A central aperture 110 extends between the upstanding ribs on the inner square. Incorporating these apertures also minimizes the accumulation of internal stresses during manufacture and reduces production costs. Specifically, the apertures reduce the quantity of molding material in the tray 10. This reduces material costs. As production molding machinery must be sized for the total volume of the material in a device, this design also reduces production equipment costs.

The tray 10 shown in FIGS. 1 and 2 has additional elements that conform the tray 10 to industry standards. For example, industry standard clips 111 extend from each of the end beams 27 and 30. The overall size of each tray also conforms to industry standards. However, it also can be important that the effective size of each of the pocket storage areas be identical The tray 10 shown in FIGS. 1 and 2 includes a means for providing such uniform effective pocket storage area sizes without a need for custom designing each tray. The storage pocket areas 37, 38, 40, 43, 44 and 45, have equal areas defined by the lattice framework 24. In the specific embodiment shown in FIG. 2, however, the areas defined by the beams at the pocket storage areas 36, 41, 42 and 46 are greater. Vertically extending transverse ribs 112 formed in the beams 27 and 30 in each of pocket storage areas 36 and 41 define a vertical plane parallel to the beam 27. The ends of the ribs that define this plane are spaced from the adjacent cross beams, such as cross beam 32, the same distance as the distance between adjacent cross beams 32 and 33, for example. Thus the overall effective area for storing PGA components is the same for each storage pocket area. The design of a specific tray is readily adapted because it is only necessary to define the depth of the ribs 112 to provide a uniform cross-section for all the storage pocket areas. Moreover, the ribs 112 define an effective surface without the addition of significant quantities of molding materials.

Figure 7:
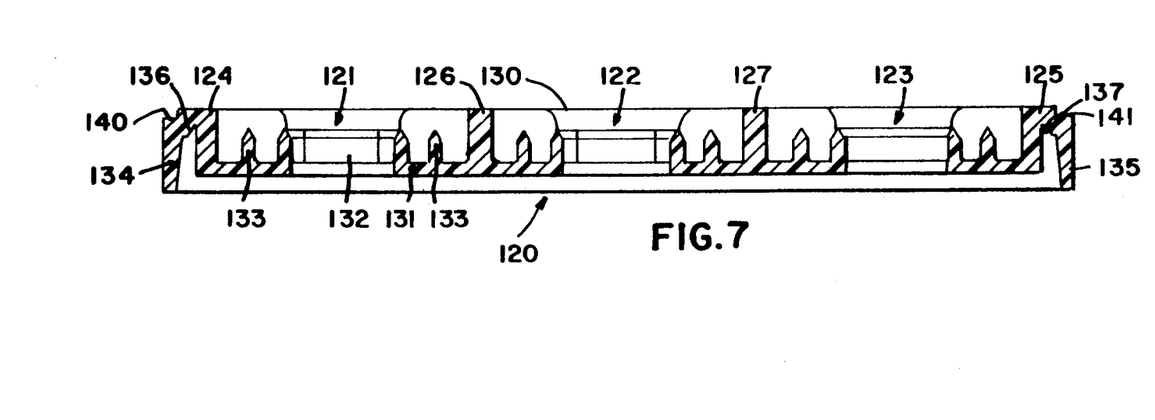
FIG. 7 is a cross-sectional view analogous to the view in FIG. 3 that depicts another embodiment of a device constructed in accordance with this invention.

FIG. 7 discloses an alternate tray construction that provides a greater storage density for smaller PGA components. Specifically a tray 120 in FIG. 7 stores PGA components in three rows and seven columns for a total of twenty-one storage pocket areas The cross-section shown in FIG. 7 depicts three storage pocket areas 121, 122 and 123 for receiving PGA components with a pin array up to thirteen rows and columns. In this specific configuration, a front beam 124 and back beam 125 form a portion of a lattice framework with intermediate beams 126 and 127. A series of transverse beams including a beam 130 define column positions for the different storage pocket areas.

Referring to storage pocket area 121, a base plate section 131 spans the beams 124, 126 and the outer beam (not shown) that defines the storage pocket area 121. A first set of upstanding ribs 132 lie on the sides of an inner square and a second set of ribs 133 lie on an intermediate portions of an outer square thereby to define two sets of upstanding rib means with the rib means in each set being coextensive with intermediate portions of the sides of a square that is concentric with and spaced from another square defined by the other set of upstanding rib means. The construction and spacing of the rib means is the same as in the structure shown in FIG. 1.

When, for example, such a configuration is sized for a 13 ×13 matrix PGA component, the overall dimension between the front and back beams 124 and 125 is less than the required overall dimension for an industry standard tray. In this particular embodiment the tray is enlarged to standard size by the use of outer beams 134 and 135 and spacing web portions 136 and 137. The juncture of the web portions 136 and 137 form shoulders 140 and 141 respectively that receive the bottom lip extensions of the outer beams corresponding to beams 134 and 135 of a tray stacked above the tray 120.

In this particular embodiment the base plate section 131 extends from the four beams that define each storage pocket area. Clearances, such as the clearance between the base support 50 and the intermediate beam 35 in FIG. 2, may not be necessary because the decreased percentage of the base support area to the total area of each pocket storage means can permit cooling of an injection molded tray without the introduction of permanent stresses that could otherwise deform the tray.

The trays shown in FIGS. 1 through 7 therefore meet several objectives of this invention. They are economical to produce because they require a minimal amount of molding material and reduce the size and cost of the equipment required to mold the trays. The trays are dimensionally stable so automated production equipment can accurately determine the location of each upstanding rib in the tray from a reference position on the tray. The tapered upstanding ribs minimize any potential for damage to terminal pins during manual or automatic loading and support a PGA component housing with the ends of the depending terminal pins spaced from the tray. This blocks the transfer to the terminal pins of forces acting along the axes of these terminal pins. Lateral forces tend to be distributed among several pins thereby to minimize any potential for damage. The trays constructed in accordance with this invention are stackable to allow the bulk storage of a number of trays. Each tray can store PGA components in a wide range of package sizes.

This invention has been disclosed in terms of certain embodiments It will be apparent that many modifications can be made to the disclosed apparatus without departing from the invention. Therefore, it is the intent of the appended claims to cover all such variations and modifications as come within the true spirit and scope of this invention.

What is claimed as new and desired to be secured by Letters Patent of the United States is:

1. A tray for storing an integrated circuit component, the integrated circuit component having a housing and an array of terminal pins of a predetermined length extending from the housing in predetermined column and row positions with predetermined spacings, said tray comprising:
   A. framework means for defining a periphery of a storage pocket area,
   B. base support means spanning said portions of said framework means for forming said storage pocket area, and
   C. a plurality of sets of upstanding rib means within the storage pocket area extending from said base support means for engaging the integrated circuit component housing, said upstanding rib means in a set being coextensive with intermediate portions of each of the sides of concentric rectangles centered intermediate certain of the column and row positions of the terminal pins thereby to support the housing along orthogonal lines with the terminal pins spaced from said base support means.

2. A tray for an integrated circuit component as recited in claim 1 wherein each of said rib means includes a base portion extending transversely from said base support means and a tapered portion at the free end of each said base portion.

3. A tray for an integrated circuit component as recited in claim 1 wherein each said rib means in each of said first and additional sets of upstanding rib means lie on portions of the sides of equally spaced concentric squares and wherein the spacing of the squares depends upon the predetermined spacing between adjacent columns and rows of terminal pins from the integrated circuit component.

4. A tray for an integrated circuit component as recited in claim 1 wherein said framework means comprises an open matrix of interconnected transverse beams that define matrix storage pocket areas, each having base support means and a plurality of sets of upstanding rib means.

5. A tray for an integrated circuit component as recited in claim 4 wherein certain of said base support means have a cruciform shape with the extensions thereon being connected to all of said interconnected transverse beams that define the corresponding storage pocket area.

6. A tray for an integrated circuit component as recited in claim 5 wherein certain others of said base support means have a cruciform shape with certain of said extensions being connected to adjacent ones of said beams that define said storage pocket area and at least one of said extensions terminates in a spaced relationship with respect to the adjacent beam.

7. A tray for storing a plurality of pin grid array integrated circuit components wherein each component has a planar housing with a first planar surface and an array of terminal pins of predetermined length extending perpendicularly from the first planar surface, the array being defined by terminal pins in predetermined rows and columns and with predetermined spacings, said tray comprising:
   A. framework means for defining the periphery of a plurality of discrete storage pocket areas,
   B. a base plate portion spanning portions of said framework means about the periphery of each storage pocket area, and
   C. a plurality of sets of upstanding rib means within each said storage pocket area extending from said base plate means for engaging the first planar surface of the component housing, said upstanding rib means in each said set being coextensive with intermediate portions of the sides of one of a plurality of concentric rectangles centered intermediate certain of the column and row positions of the terminal pins thereby to support the housing along orthogonal lines with the terminal pins spaced from said base plate means and certain of the terminal means being adjacent said upstanding rib means, said upstanding rib means in one set being spaced from said upstanding rib means in another set by a distance corresponding to the predetermined row and column spacings of the terminal pins.

8. A tray for storing a plurality of pin grid array integrated circuit components as recited in claim 7 wherein each of said rib means in each of said first and additional sets of upstanding rib means lies on the portions of the sides of equally spaced concentric squares.

9. A tray for storing a plurality of pin grid array integrated circuit components as recited in claim 7 wherein each of said rib means includes a base portion extending transversely from said base plate means and a tapered portion at the free end of each said base portion.

10. A tray for storing a plurality of pin grid array integrated circuit components as recited in claim 7 wherein said framework means comprises an open matrix of interconnected transverse beams that define the matrix of storage pocket areas.

11. A tray for storing a plurality of pin grid array integrated circuit components as recited in claim 10 wherein certain of said base plate means have a cruciform shape with the extensions thereon being connected to all the interconnected transverse beams that define the corresponding storage pocket area.

12. A tray for storing a plurality of pin grid array integrated circuit components as recited in claim 11 wherein certain others of said base plate means have a cruciform shape with certain of said extensions being connected to adjacent ones of said transverse beams that define said storage pocket area, at least one of said extensions terminating in a spaced relationship with respect to its proximate beam.

13. A tray for storing a plurality of pin grid array integrated circuit components as recited in claim 10 wherein certain of said parallel beams are common to adjacent storage pocket areas and have access passages formed therein intermediate the lengths thereof for facilitating the removal of a component from said tray.

14. A tray for storing a plurality of pin grid array integrated circuit components as recited in claim 10 wherein a template having a plurality of apertures coextensive with certain of said storage pocket areas formed therein overlies the storage pocket areas for facilitating the accurate insertion of a component in said storage pocket areas and wherein said template and certain of said storage pocket areas have means formed thereon for aligning said template with respect to said tray.

15. A tray for storing a plurality of pin grid array integrated circuit components as recited in claim 10 wherein certain of said transverse beams define the periphery of said tray, said beams having oppositely disposed shoulder and lip portions formed about the periphery of said tray for facilitating the stacking of individual trays.

16. A tray for storing a plurality of pin grid array integrated circuit components as recited in claim 15 wherein said tray is molded from a high-temperature dimensionally stable material taken from the group consisting of polyether sulfones, polyether imides, polyaeryl sulfones and polyesters having a filler from the group consisting of carbon and aluminum.

17. A tray for storing a plurality of pin grid array integrated circuit components as recited in claim 15 wherein said tray is molded from an insulating, filled, dimensionally stable thermoplastic material.

18. A tray for storing a plurality of pin grid array integrated circuit components as recited in claim 7 wherein said tray is molded from a high-temperature material comprising a polyether sulfone and carbon filler.

19. A tray for storing a plurality of pin grid array integrated circuit components as recited in claim 7 wherein said tray is molded from an insulating, filled, dimensionally stable thermoplastic material.

20. An integral tray for storing an integrated circuit component characterized by having a housing and an array of terminal pins of a predetermined length extending from the housing in predetermined column and row positions with predetermined spacings, said tray comprising:

D. framework means for defining a periphery of a storage pocket area,

E. base support means spanning said portions of said framework means for forming said storage pocket area, and F. a plurality of spaced, orthogonal upstanding discrete rib means within the storage pocket area extending from said base support means for engaging the integrated circuit component housing, each said upstanding rib means being coextensive with an intermediate portion of a side of a rectangle that is centered intermediate certain of the terminal pin column and row positions and extending between the terminal pins to engage the housing along orthogonal lines and to store an integrated circuit component with the terminal pins being spaced from said base support means.

21. A tray for storing an integrated circuit component as recited in claim 20 wherein said set of upstanding rib means constitutes a first set and said tray comprises at least one additional set of upstanding rib means, said rib means in an additional set being coextensive with intermediate portions of the sides of a rectangle that is spaced from the rectangle of said first set by a distance corresponding to the spacing between adjacent terminals on the integrated circuit component.

22. A tray for an integrated circuit component as recited in claim 21 wherein the rectangles for each set of upstanding ribs are concentric.

* * * * *